United States Patent [19]

Barrett, Jr. et al.

[11] Patent Number: 5,552,750

[45] Date of Patent: Sep. 3, 1996

[54] METHOD AND APPARATUS FOR DETERMINING AN INSTANTANEOUS PHASE DIFFERENCE BETWEEN TWO SIGNALS

[75] Inventors: Raymond L. Barrett, Jr., Ft. Lauderdale; Barry W. Herold, Boca Raton; Grazyna A. Pajunen, Delray Beach, all of Fla.

[73] Assignee: Motorola, Inc., Schaumburg, Ill.

[21] Appl. No.: 523,665

[22] Filed: Sep. 5, 1995

[51] Int. Cl.$^6$ ............................. H03L 7/091; H03L 7/18
[52] U.S. Cl. ................... 331/25; 331/16; 331/18; 327/7; 327/9; 327/105; 327/156; 455/260
[58] Field of Search ........................... 331/1 A, 16–18, 331/25, 45, 57; 329/307–309, 345, 346; 327/5, 7–9, 12, 105–107, 156–159; 455/260; 375/376; 360/51

[56] References Cited

U.S. PATENT DOCUMENTS

| | | | |
|---|---|---|---|
| 3,590,381 | 6/1971 | Ragsdale | 327/9 X |
| 4,167,711 | 9/1979 | Smoot | 331/17 |
| 4,626,796 | 12/1986 | Elder | 331/1 A |
| 4,672,329 | 6/1987 | Hikawa | 331/1 A |
| 4,706,040 | 11/1987 | Mehrgardt | 331/1 A |
| 4,864,253 | 9/1989 | Zwack | 331/1 A |
| 4,906,944 | 3/1990 | Frerking | 331/1 A |
| 4,929,918 | 5/1990 | Chung et al. | 331/10 |
| 5,121,070 | 6/1992 | Tomita | 329/304 |
| 5,122,761 | 6/1992 | Wischermann | 331/1 A |
| 5,182,528 | 1/1993 | Zuta | 331/1 A |

*Primary Examiner*—David Mis
*Attorney, Agent, or Firm*—R. Louis Breeden

[57] ABSTRACT

A method and apparatus determine an instantaneous phase difference (207) between a reference signal (103) and a controlled signal (120). The reference signal (103) is derived by frequency dividing a first signal by a counter (106) including an output (107) having K sequential states, wherein K is an integer value equal to the frequency of the first signal (103) divided by the frequency of the desired reference signal, and wherein the output (107) changes by no more than one bit between any adjacent states of the K sequential states. The output (107) of the counter (106) is recorded (206) at a time concurrent with a first predetermined event occurring in the controlled signal (120), thereby generating a recorded count value that is free from metastability induced errors. The recorded count value is decoded (208) to produce a sequential state number $S_E$ corresponding to the first predetermined event. The instantaneous phase difference (207) is then calculated (210) from $S_E$, K, and other predetermined constants.

20 Claims, 3 Drawing Sheets

METHOD AND APPARATUS FOR DETERMINING AN INSTANTANEOUS PHASE DIFFERENCE BETWEEN TWO SIGNALS

FIELD OF THE INVENTION

This invention relates in general to phase detection, and more specifically to a method and apparatus for determining an instantaneous phase difference between two signals.

BACKGROUND OF THE INVENTION

Classical frequency synthesizers, which can be programmed to two or more frequencies, inherently have slow warm-up times during the reprogramming process. The same is true during initial power-up of the frequency synthesizer. The warm-up time for a programmable frequency synthesizer is considered the time taken by the frequency synthesizer to switch from one operating frequency to a second operating frequency within a desired frequency lock range (e.g., ±10 Hz from the desired second operating frequency), or the time period needed to achieve a desired power-up frequency within a desired frequency lock range. The slow warm-up time arises from the use of phase detectors which do not measure instantaneous phase such as, for example, the source-sink-float (SSF) phase detector. To compensate for the phase detector delay, other circuit parameters in the frequency synthesizer are adjusted in ways which complicate design as well as increase cost. In addition, phase detector delay affects the phase margin and gain bandwidth of the phase-locked loop in such a way as to extend the warm-up period.

Thus, what is needed is a method and apparatus for determining an instantaneous phase difference between two signals. Preferably, the method and apparatus must measure instantaneous phase while maintaining low power consumption.

SUMMARY OF THE INVENTION

An aspect of the present invention is a method of determining an instantaneous phase difference between a reference signal operating at a desired reference frequency and a controlled signal operating asynchronously at a controlled frequency. The method comprises the steps of deriving the reference signal by frequency dividing a first signal operating at a first frequency by a counter comprising an output having K sequential states, wherein K is an integer value equal to the first frequency divided by the desired reference frequency, and wherein the output changes by no more than one bit between any adjacent states of the K sequential states, recording the output of the counter at a time concurrent with a first predetermined event occurring in the controlled signal, thereby generating a recorded count value corresponding to a current state of the counter when the counter is not executing a change from the current state to a next sequential state at said time, and generating the recorded count value selected from (a) the recorded count value corresponding to the current state and (b) the recorded count value corresponding to the next sequential state, when the counter is executing a change from the current state to the next sequential state at said time, decoding the recorded count value to produce a sequential state number $S_E$ corresponding to the first predetermined event, and determining the instantaneous phase difference (in degrees) to be equal to $$\frac{S_E - S_P}{K} \times 360,$$

wherein $S_P$ is a predetermined sequential state number corresponding to a second predetermined event occurring in the reference signal.

Another aspect of the present invention is a communication device, comprising a receiver for receiving a signal including information, a processing system coupled to the receiver for control thereof and for processing the information, an information interface coupled to the processing system for conveying the information to a user, user controls coupled to the processing system for providing control of the communication device by the user, an oscillator for providing a first signal operating at a first frequency, a voltage controlled oscillator (VCO) coupled to the processing system for generating a controlled signal operating asynchronously at a controlled frequency, and an apparatus coupled to the VCO for determining an instantaneous phase difference between a reference signal operating at a desired reference frequency, and the controlled signal. The apparatus comprises a counter coupled to the oscillator for deriving the reference signal by frequency dividing the first signal, the counter comprising an output having K sequential states, wherein K is an integer value equal to the first frequency divided by the desired reference frequency, and wherein the output changes by no more than one bit between any adjacent states of the K sequential states. The apparatus further comprises a register coupled to the counter for recording the output of the counter at a time concurrent with a first predetermined event occurring in the controlled signal, thereby generating a recorded count value corresponding to a current state of the counter when the counter is not executing a change from the current state to a next sequential state at said time, and generating the recorded count value selected from (a) the recorded count value corresponding to the current state and (b) the recorded count value corresponding to the next sequential state, when the counter is executing a change from the current state to the next sequential state at said time. The apparatus also comprises a decoder coupled to the register for decoding the recorded count value to produce a sequential state number $S_E$ corresponding to the first predetermined event, wherein the processing system is coupled to the decoder for determining the instantaneous phase difference (in degrees) to be equal to $$\frac{S_E - S_P}{K} \times 360,$$

wherein $S_P$ is a predetermined sequential state number corresponding to a second predetermined event occurring in the reference signal.

DESCRIPTION OF THE PREFERRED EMBODIMENT

Figure 1:
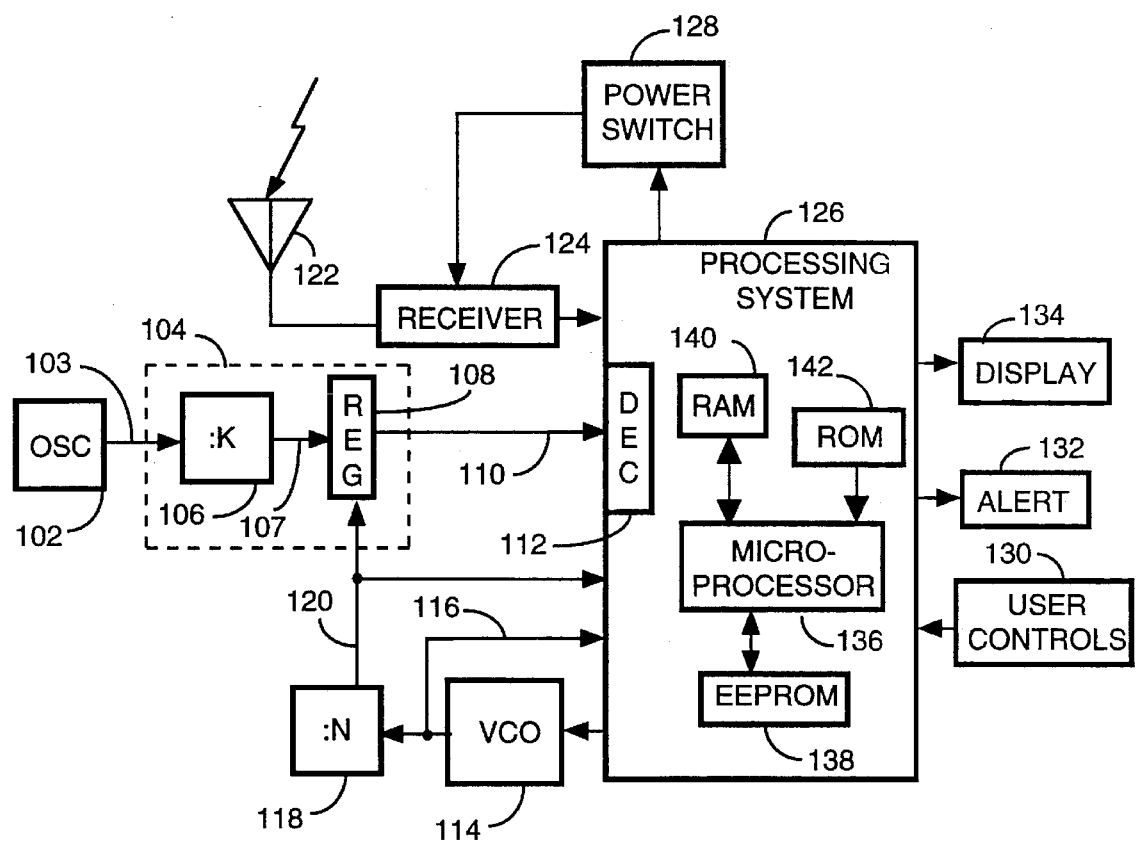
FIG. 1 is an electrical block diagram of a communication device employing a frequency synthesizer which utilizes an instantaneous phase detector in accordance with the preferred embodiment of the present invention.

FIG. 1 is an electrical block diagram of the communication device 100 in accordance with the preferred embodiment of the present invention. The communication device 100 includes a receiver antenna 122 for intercepting radio frequency (RF) signals comprising messages from a transmitting station (not shown). The receiver antenna 122 is coupled to a receiver 124 applying conventional demodulation techniques for receiving the RF signals. Once the RF signals have been demodulated, the receiver 124 generates demodulated message information which is presented to a processing system 126 for processing.

A conventional power switch 128, coupled to the processing system 126, is used to control the supply of power to the receiver 124, thereby providing a battery saving function.

To perform the necessary functions of the communication device 100, the processing system 126 includes, a microprocessor 136, a random access memory (RAM) 140, a read-only memory (ROM) 142, and an electrically erasable programmable read-only memory (EEPROM) 138.

Preferably, the microprocessor 136 is similar to the M68HC08 micro-controller manufactured by Motorola, Inc. It will be appreciated that other similar processors can be utilized for the microprocessor 136, and that additional processors of the same or alternative type can be added as required to handle the processing requirements of the processing system 126. It will also be appreciated that other types of memory, e.g., EEPROM or FLASH, can be utilized for the ROM 142, as well as the RAM 140. It will be further appreciated that the RAM 140 and the ROM 142, singly or in combination, can be integrated as an integral portion of the processing system 126.

The processing system 126 is programmed by way of the ROM 142 to process incoming messages transmitted by the transmitting station. During message processing, the processing system 126 decodes in a conventional manner an address in the demodulated message information, compares the decoded address with one or more addresses stored in the EEPROM 138, and when a match is detected, the processing system 126 proceeds to process the remaining portion of the message.

Once the processing system 126 has processed the message, it stores the message in the RAM 140, and a call alerting signal is generated to alert a user that a message has been received. The call alerting signal is directed to a conventional audible or tactile alerting device 132 for generating an audible or tactile call alerting signal.

The message can be accessed by the user through user controls 130, which provide functions such as lock, unlock, delete, read, etc. More specifically, by the use of appropriate functions provided by the user controls 130, the message is recovered from the RAM 140, and then conveyed to the user by way of an information interface comprising a display 134 for displaying the message, e.g., a conventional liquid crystal display (LCD).

The processing system 126 is also coupled to a frequency synthesizer providing the function of a phase-locked loop (PLL) utilized for clock generation to the microprocessor 136 core circuitry.

The frequency synthesizer comprises a voltage-controlled oscillator (VCO) 114, a divide by N frequency counter 118 (herein described as the N counter 118), an oscillator 102, a decoder 112, and an instantaneous phase detector 104, comprising a divide by K frequency counter 106 (herein described as the K counter 106) and a register 108. It will be appreciated that the frequency synthesizer, not including the oscillator 102 and the VCO 114, can be integrated as an integral portion of the processing system 126.

The oscillator 102 is a conventional reference oscillator used for supplying a first signal 103 operating at a first frequency coupled to the instantaneous phase detector 104. The instantaneous phase detector 104 divides the first signal by K to produce a reference signal operating at a desired reference frequency. The instantaneous phase detector 104 then measures the instantaneous phase between the reference signal and a controlled signal (supplied by the VCO 114 and the N counter 118, as will be described below) operating asynchronously at a controlled frequency.

The VCO 114 is a conventional VCO controlled by the processing o system 126 preferably with a digital-to-analog converter (not shown). The N counter 118 is a conventional counter with N sequential states. The N counter 118 is utilized by the frequency synthesizer for generating at the output of the VCO 1.14 a desired signal 116 operating at N/K times the frequency of the first signal 103. In performing this function, the N counter 118 generates a strobe signal 120, coupled to the instantaneous phase detector 104, providing a marker that defines the controlled signal operating at the controlled frequency and asynchronous to the first signal 103. The strobe signal 120 triggers the instantaneous phase detector 104 to measure instantaneous phase.

The strobe signal 120 is also coupled to the processing system 126 serving as an interrupt trigger to the microprocessor 136. The interrupt informs the processing system 126 that a new instantaneous phase measurement is available for processing.

The instantaneous phase detector 104 comprises a divide by K frequency counter 106 (herein described as the K counter 106), and a register 108. The K counter 106 preferably is a conventional Gray Code counter. As is well known by one of ordinary skill in the art, the Gray Code counter provides state transitions with a single bit change between adjacent states. This feature requires minimal power consumption for instantaneous phase detection. It will be appreciated that, alternatively, the K counter 106 can utilize a Johnson counter which also provides single bit changes during state transitions.

The output of the K counter 106 is coupled to a register 108 with $$\frac{\log K}{\log 2}$$

(rounded upward to the next integer value) bits of information.

The register 108 is also coupled to the strobe signal 120 provided by the N counter 118. When the edge of the strobe signal 120 is active (e.g., rising edge), the sequential state of the K counter 106 is recorded by the register 108. The recording of the output of the K counter 106 may occur in one of two ways, and corresponds to a first predetermined event, e.g., a low-to-high transition, occurring in the controlled signal. First, the sampling of the K counter 108 may occur when the K counter 108 is not sequentially switching states. In this case, the sampling of the K counter value encounters no metastability. In a second scenario, the sampling of the K counter 106 occurs when the K counter is sequentially switching states. In this second case, the K counter value sampled is subject to metastability conditions.

Since the K counter employs a Gray Code sequential state assignment, the value sampled by the register 108 can only be in error by a single sequential state. That is, the value lies somewhere between the previous state of the counter and the present state of the counter after the transition. Therefore, the instantaneous phase detector 104 is subject to a maximum of a single bit error during phase sampling. It is important to note that the higher the resolution of the K counter 106 (i.e., higher K) the lower the inaccuracy in the measured phase sampled by the instantaneous phase detector 104.

The recorded digitized phase error logged by the register 108 is provided to the processing system 126 by way of the decoder 112. The decoder 112 decodes the recorded count value to produce a sequential state number $S_E$ corresponding to the first predetermined event.

It will be appreciated that both the reference signal and the controlled signal can be output by the K counter 106 and the N counter 118, respectively, as usable output signals. In the preferred embodiment, however, the reference signal and the controlled signal are internal signals only, and are not usable, generated output signals. It will be further appreciated that, in an alternative embodiment, the phase detection roles of the K counter 106 and the N counter 118 can be swapped. That is, the K counter can generate a strobe signal upon the occurrence of an event (e.g., rising edge) occurring in the reference signal for registering the count of the N counter at the time of the event. The registered count of the N counter relative the same event occurring in the controlled signal (e.g., full count of N) can then be used to determine the phase error.

Figure 2:
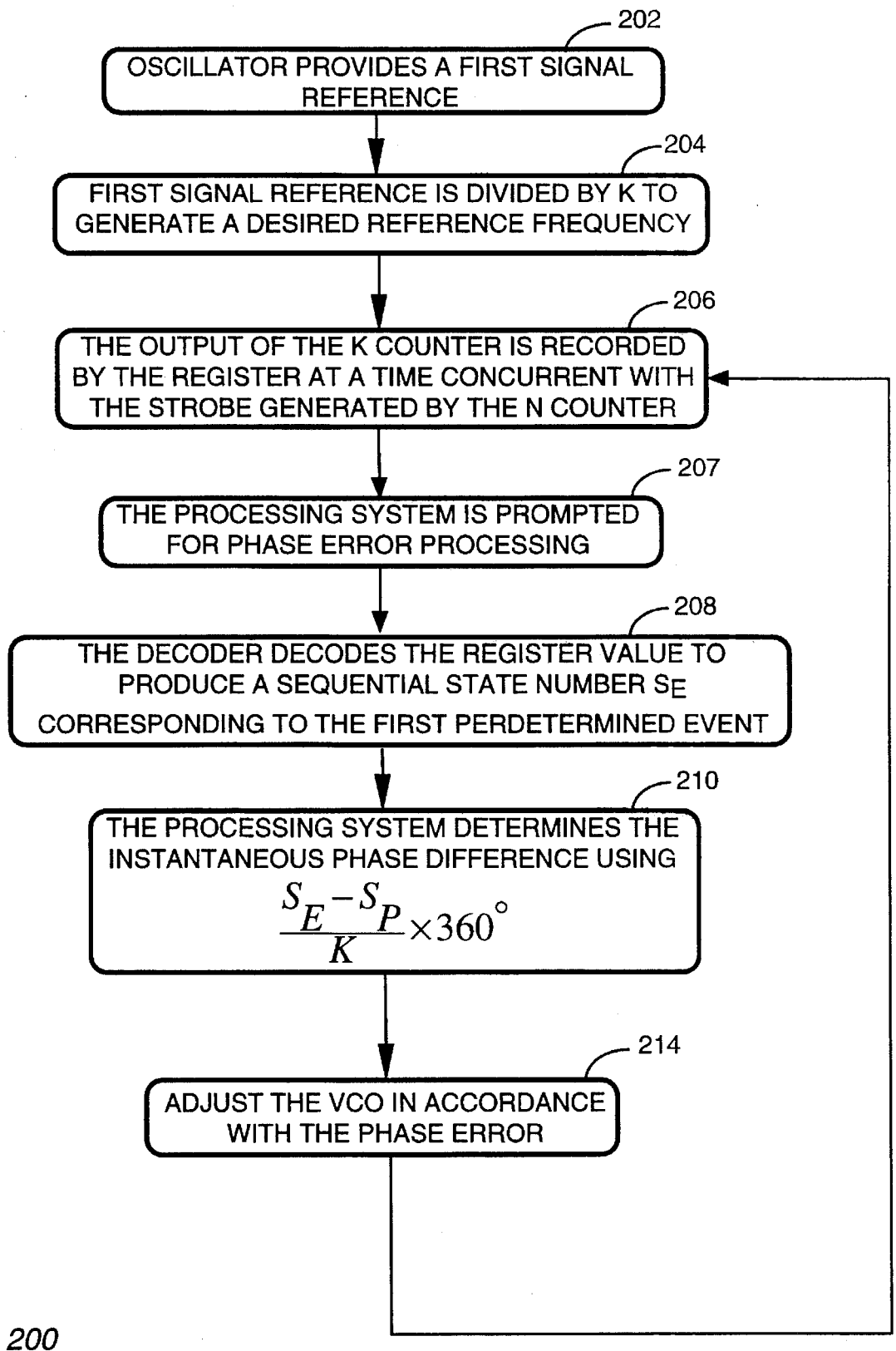
FIG. 2 is a flow chart depicting operation of the frequency synthesizer of FIG. 1 in accordance with the preferred embodiment of the present invention.

FIG. 2 is a flow chart 200 depicting operation of the frequency synthesizer of FIG. 1 in accordance with the preferred embodiment of the present invention. The flow chart 200 begins with step 202 where the oscillator 102 provides the first signal reference 103 to the instantaneous phase detector 104. In step 204, the instantaneous phase detector 104 divides the first signal reference by K to generate a desired reference frequency. In step 206, the output of the K counter 106 is recorded by the register 108 at a time concurrent with the strobe signal 120 generated by the N counter 118. Subsequently, in step 207 the processing system 126 is prompted to perform phase error processing. In step 208, the processing system 126 invokes the decoder 112 to decode the register value to produce a sequential state number $S_E$ corresponding to the first predetermined event. In step 210, the processing system 126 determines the instantaneous phase difference using $$\frac{S_E - S_P}{K} \times 360°$$

where $S_P$ is a predetermined sequential state number corresponding to a second predetermined event occurring in the reference signal. In step 214 the processing system 126 adjusts the VCO 114 frequency accordingly. The adjustment is proportional to the phase error calculated above. The processing system 126 then continues to step 206 for further phase error processing.

Figure 3:
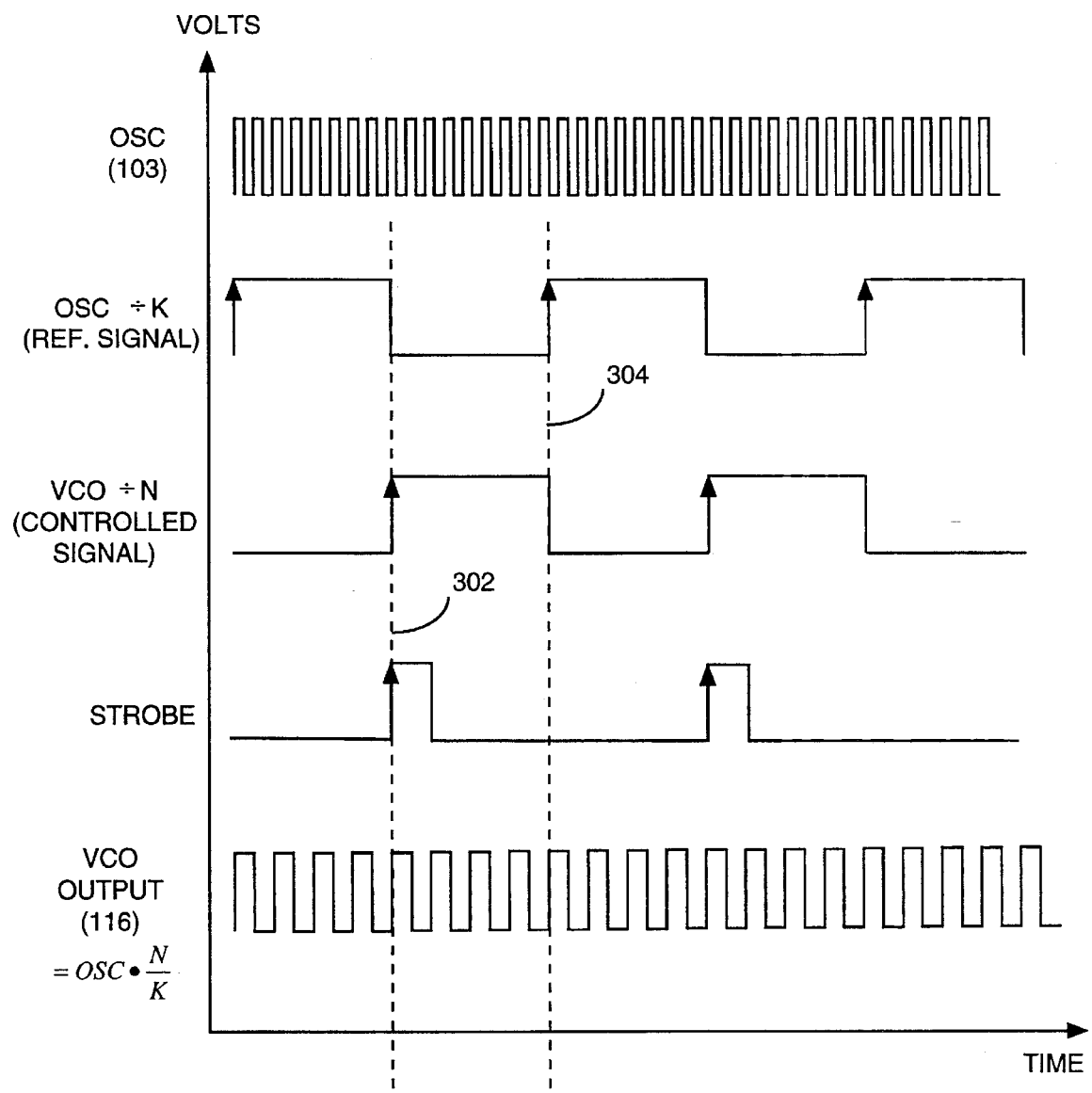
FIG. 3 is a timing diagram depicting operation of the instantaneous phase detector in accordance with the preferred embodiment of the present invention.

FIG. 3 is a timing diagram depicting operation of the instantaneous phase detector 104 in accordance with the preferred embodiment of the present invention. FIG. 3 shows the first signal 103 of the oscillator 102, the first signal 103 divided by K (i.e., the reference signal), the VCO 114 divided by N (i.e., the controlled signal), the strobe signal 120, and the VCO 114 desired output signal 116. In this example the OSC÷K and the VCO÷N signals happen to be 180° out of phase. Starting at time boundary 302 (the rising edge of the controlled signal) the strobe signal 120 is activated. At this point in time the register 108 stores the current state of the K counter 106. This count translates to $S_E$ by the decoder 112, as described above. Assuming for instance that K=100, then for this example $S_{E=}50$ (i.e., 180° phase difference). At the arrival of boundary 304 (i.e., the next rising edge of OSC÷K signal) $S_{P=}100$, i.e., the full count of the K counter 106, or equivalently the next clock cycle of OSC+K signal. Inserting these numbers into the above equation results in a calculated phase error of $$\frac{50 - 100}{100} \times 360° = -180°$$

which corresponds to the phase error shown in the FIG. 3 example. Note the numbers used for $S_E$ and $S_P$ correspond to modulo K numbers incremented by one (i.e., 0 corresponds to 1, 1 corresponds 2, etc.). In addition, the reference signal and controlled signals can be internal or conceptual signals shown by way of illustration, they do not have to be actually generated and output.

Thus, it should be apparent by now that the present invention provides a method and apparatus for determining an instantaneous phase difference between two signals. In particular, the invention advantageously provides a novel method and apparatus utilizing a Gray Code counter (or the like) which provides minimal power consumption, and instantaneous phase determination with a maximum of a single bit of indeterministic error. This error can be minimized by increasing the resolution of the K counter 106, as described above. Furthermore, in providing an instantaneous phase measurement, the present invention advantageously provides an improved warm-up time during power-up, or frequency switching which prior art systems (such as sink-source-float phase detectors) have not been able to achieve.

What is claimed is:

1. A method of determining an instantaneous phase difference between a reference signal operating at a desired reference frequency and a controlled signal operating asynchronously at a controlled frequency, the method comprising the steps of:

deriving the reference signal by frequency dividing a first signal operating at a first frequency by a counter comprising an output having K sequential states, wherein K is an integer value equal to the first frequency divided by the desired reference frequency, and wherein the output changes by no more than one bit between any adjacent states of the K sequential states;

recording the output of the counter at a time concurrent with a first predetermined event occurring in the controlled signal, thereby generating a recorded count value corresponding to a current state of the counter when the counter is not executing a change from the current state to a next sequential state at said time, and generating the recorded count value selected from (a) the recorded count value corresponding to the current state and (b) the recorded count value corresponding to the next sequential state, when the counter is executing a change from the current state to the next sequential state at said time;

decoding the recorded count value to produce a sequential state number $S_E$ corresponding to the first predetermined event; and determining the instantaneous phase difference (in degrees) to be equal to $$\frac{S_E - S_P}{K} \times 360,$$

wherein $S_P$ is a predetermined sequential state number corresponding to a second predetermined event occurring in the reference signal.

2. The method of claim 1, wherein the controlled signal and the reference signal are digital signals, and wherein the first predetermined event comprises a level transition in the controlled signal, and wherein the second predetermined event comprises a corresponding level transition in the reference signal.

3. The method of claim 1, wherein the controlled signal and the reference signal each have an amplitude that periodically ranges both above and below a predetermined threshold, and wherein the first predetermined event comprises a crossing of the predetermined threshold by the amplitude of the controlled signal, and wherein the second predetermined event comprises a corresponding crossing of the predetermined threshold by the amplitude of the reference signal.

4. The method of claim 1, further comprising the step of
   controlling frequency of the controlled signal in response to the instantaneous phase difference determined in the determining step.

5. The method of claim 1, further comprising the step of
   controlling phase of the controlled signal in response to the instantaneous phase difference determined in the determining step.

6. An apparatus for determining an instantaneous phase difference between a reference signal operating at a desired reference frequency and a controlled signal operating asynchronously at a controlled frequency, the apparatus comprising:
   a counter for deriving the reference signal by frequency dividing a first signal operating at a first frequency, the counter comprising an output having K sequential states, wherein K is an integer value equal to the first frequency divided by the desired reference frequency, and wherein the output changes by no more than one bit between any adjacent states of the K sequential states;
   a register coupled to the counter for recording the output of the counter at a time concurrent with a first predetermined event occurring in the controlled signal, thereby generating a recorded count value corresponding to a current state of the counter when the counter is not executing a change from the current state to a next sequential state at said time, and generating the recorded count value selected from (a) the recorded count value corresponding to the current state and (b) the recorded count value corresponding to the next sequential state, when the counter is executing a change from the current state to the next sequential state at said time;
   a decoder coupled to the register for decoding the recorded count value to produce a sequential state number $S_E$ corresponding to the first predetermined event; and
   a processing system coupled to the decoder for determining the instantaneous phase difference (in degrees) to be equal to $$\frac{S_E - S_P}{K} \times 360,$$

wherein $S_P$ is a predetermined sequential state number corresponding to a second predetermined event occurring in the reference signal.

7. The apparatus of claim 6, wherein the controlled signal and the reference signal are digital signals, and wherein the first predetermined event comprises a level transition in the controlled signal, and wherein the second predetermined event comprises a corresponding level transition in the reference signal.

8. The apparatus of claim 6, wherein the controlled signal and the reference signal each have an amplitude that periodically ranges both above and below a predetermined threshold, and wherein the first predetermined event comprises a crossing of the predetermined threshold by the amplitude of the controlled signal, and wherein the second predetermined event comprises a corresponding crossing of the predetermined threshold by the amplitude of the reference signal.

9. The apparatus of claim 6, further comprising
   a phase locked loop which includes the processing system for controlling frequency of the controlled signal in response to the instantaneous phase difference determined by the processing system.

10. The apparatus of claim 6, further comprising
    a phase locked loop which includes the processing system for controlling phase of the controlled signal in response to the instantaneous phase difference determined by the processing system.

11. A communication device, comprising:
    a receiver for receiving a signal including information;
    a processing system coupled to the receiver for control thereof and for processing the information;
    an information interface coupled to the processing system for conveying the information to a user;
    user controls coupled to the processing system for providing control of the communication device by the user;
    an oscillator for providing a first signal operating at a first frequency;
    a voltage controlled oscillator (VCO) coupled to the processing system for generating a controlled signal operating asynchronously at a controlled frequency; and
    an apparatus coupled to the VCO for determining an instantaneous phase difference between a reference signal operating at a desired reference frequency, and the controlled signal, the apparatus comprising:
       a counter coupled to the oscillator for deriving the reference signal by frequency dividing the first signal, the counter comprising an output having K sequential states, wherein K is an integer value equal to the first frequency divided by the desired reference frequency, and wherein the output changes by no more than one bit between any adjacent states of the K sequential states;
       a register coupled to the counter for recording the output of the counter at a time concurrent with a first predetermined event occurring in the controlled signal, thereby generating a recorded count value corresponding to a current state of the counter when the counter is not executing a change from the current state to a next sequential state at said time, and generating the recorded count value selected from (a) the recorded count value corresponding to the current state and (b) the recorded count value corresponding to the next sequential state, when the counter is executing a change from the current state to the next sequential state at said time; and a decoder couple to the register for decoding the recorded count value to produce a sequential state number $S_E$ corresponding to the first predetermined event, wherein the processing system is coupled to the decoder for determining the instantaneous phase difference (in degrees) to be equal to $$\frac{S_E - S_P}{K} \times 360,$$

wherein $S_P$ is a predetermined sequential state number corresponding to a second predetermined event occurring in the reference signal.

12. The communication device of claim 11, wherein the controlled signal and the reference signal are digital signals, and wherein the first predetermined event comprises a level transition in the controlled signal, and wherein the second predetermined event comprises a corresponding level transition in the reference signal.

13. The communication device of claim 11, wherein the controlled signal and the reference signal each have an amplitude that periodically ranges both above and below a predetermined threshold, and wherein the first predetermined event comprises a crossing of the predetermined threshold by the amplitude of the controlled signal, and wherein the second predetermined event comprises a corresponding crossing of the predetermined threshold by the amplitude of the reference signal.

14. The communication device of claim 11, further comprising a phase locked loop which includes the processing system for controlling frequency of the controlled signal in response to the instantaneous phase difference determined by the processing system.

15. The communication device of claim 11, further comprising a phase locked loop which includes the processing system for controlling phase of the controlled signal in response to the instantaneous phase difference determined by the processing system.

16. A method of determining an instantaneous phase difference between a reference signal operating at a desired reference frequency and a controlled signal operating asynchronously at a controlled frequency, the method comprising the steps of:

deriving the controlled signal by frequency dividing a first signal operating at a first frequency by a counter comprising an output having N sequential states, wherein N is an integer value equal to the first frequency divided by the controlled frequency, and wherein the output changes by no more than one bit between any adjacent states of the N sequential states;

recording the output of the counter at a time concurrent with a first predetermined event occurring in the reference signal, thereby generating a recorded count value corresponding to a current state of the counter when the counter is not executing a change from the current state to a next sequential state at said time, and generating the recorded count value selected from (a) the recorded count value corresponding to the current state and (b) the recorded count value corresponding to the next sequential state, when the counter is executing a change from the current state to the next sequential state at said time;

decoding the recorded count value to produce a sequential state number $S_E$ corresponding to the first predetermined event; and determining the instantaneous phase difference (in degrees) to be equal to $$\frac{S_E - S_P}{N} \times 360,$$

wherein $S_P$ is a predetermined sequential state number corresponding to a second predetermined event occurring in the controlled signal.

17. The method of claim 16, wherein the controlled signal and the reference signal are digital signals, and wherein the first predetermined event comprises a level transition in the reference signal, and wherein the second predetermined event comprises a corresponding level transition in the controlled signal.

18. The method of claim 16, wherein the controlled signal and the reference signal each have an amplitude that periodically ranges both above and below a predetermined threshold, and wherein the first predetermined event comprises a crossing of the predetermined threshold by the amplitude of the reference signal, and wherein the second predetermined event comprises a corresponding crossing of the predetermined threshold by the amplitude of the controlled signal.

19. The method of claim 16, further comprising the step of controlling frequency of the controlled signal in response to the instantaneous phase difference determined in the determining step.

20. The method of claim 16, further comprising the step of controlling phase of the controlled signal in response to the instantaneous phase difference determined in the determining step.

* * * * *